United States Patent [19]

Wengenroth et al.

[11] Patent Number: 5,498,506

[45] Date of Patent: Mar. 12, 1996

[54] POSITIVE-ACTING RADIATION-SENSITIVE MIXTURE AND RECORDING MATERIAL PRODUCED THEREWITH

[75] Inventors: Horst Wengenroth, Westerburg; Horst Roeschert, Ober-Hilbersheim; Walter Spiess, Dieburg; Gerhard Buhr, Koenigstein, all of Germany; Georg Pawlowski, Tokyo, Japan

[73] Assignee: Hoechst Aktiengesellschaft, Frankfurt, Germany

[21] Appl. No.: 362,491

[22] PCT Filed: Jun. 7, 1993

[86] PCT No.: PCT/EP93/01430

§ 371 Date: Jan. 9, 1995

§ 102(e) Date: Apr. 9, 1995

[87] PCT Pub. No.: WO94/01805

PCT Pub. Date: Jan. 20, 1994

[30] Foreign Application Priority Data

Jul. 13, 1992 [DE] Germany ............ 42 22 968.5

[51] Int. Cl.$^6$ .................................................. G03C 1/492
[52] U.S. Cl. ............... 430/270.14; 430/326; 430/191
[58] Field of Search .................... 430/270, 326, 430/191

[56] References Cited

U.S. PATENT DOCUMENTS

| | | | |
|---|---|---|---|
| 4,387,152 | 6/1983 | Stahlhofen | 430/191 |
| 5,106,718 | 4/1992 | Bartmann et al. | 430/191 |
| 5,110,708 | 5/1992 | Kim | 430/270 |
| 5,320,931 | 6/1994 | Umehara et al. | 430/270 |
| 5,338,641 | 8/1994 | Pawlowski et al. | 430/270 |
| 5,340,682 | 8/1994 | Pawlowski et al. | 430/165 |
| 5,364,734 | 11/1994 | Pawlowski et al. | 430/191 |

FOREIGN PATENT DOCUMENTS

| | | |
|---|---|---|
| 2066148 | 10/1992 | Canada . |
| 0146411 | 6/1985 | European Pat. Off. . |
| 0487794 | 6/1992 | European Pat. Off. . |
| 0505094 | 9/1992 | European Pat. Off. . |
| 0537524 | 4/1993 | European Pat. Off. . |
| 3738603 | 5/1989 | Germany . |
| 3835737 | 4/1990 | Germany . |
| 0417557 | 3/1991 | Germany . |
| 3930087 | 3/1991 | Germany . |
| 3935875 | 5/1991 | Germany . |
| 4124426 | 1/1992 | Germany . |
| 0519299 | 12/1992 | Germany . |

OTHER PUBLICATIONS

Japanese Abstract JP 2029750 (Pub Apr. 12, 1990), (Patent Pub Jan. 31, 1990).
Japanese Abstract JP 4068355 (Derwent) (Patent Published Mar. 4, 1992).
Japanese Abstract JP 63149640 (Pub Jun. 22, 1988) (Patent Published Nov. 2, 1988).
Japanese Abstract JP 63149638 (Pub Jun. 22, 1988) (Patent Published Nov. 2, 1988).
Japanese Abstract JP 63149637 (Pub Jun. 22, 1988) (Patent Published Nov. 2, 1988).
MacDonald et al., "Airborne Chemical Contamination of a Chemically Amplified Resist", *Advances in Resist Technology and Processing VIII*, vol. 1466:2–12, (1991).
Nalamasu et al., "Effect of Post–Exposure Delay in Positive Acting Chemically Amplified Resists: An Analytical Study", *SPE–Regional Technical Conference Photopolymers: Principles–Process and Materials*, pp. 225–234, (1991).
Schlegel et al., "Determination of Acid Diffusion in Chemical Amplification Positive Deep Ultraviolet Resists", *J. Vac. Sci. Technol.*, vol. 9(2):278–289, (1991).
Thompson et al., "Introduction to Microlithography; Theory, Materials and Processing", *ACS Symposium Series 219*, pp. 168–173 (1983).
Thompson et al., "Introduction to Microlithography; Theory, Materials, and Processing", *ACS Symposium Series 219*, pp. 89–159, (1983).

*Primary Examiner*—Marion E. McCamish
*Assistant Examiner*—Laura Weiner
*Attorney, Agent, or Firm*—Foley & Lardner

[57] ABSTRACT

The invention relates to a radiation-sensitive mixture comprising a) a binder which is insoluble in water but soluble or at least swellable in aqueous alkaline solution, b) a compound which forms an acid under the action of actinic radiation and c) a compound which contains at least one C-O-C or C-O-Si bond which can be cleaved by an acid, wherein said mixture additionally contains 0.1 to 70 mol %, based on the maximum amount of acid which can theoretically be produced from the compound b), of at least one compound having at least one nitrogen atom in an amine or amide bond. The mixture is used in particular in the production of electronic components. The invention also relates to a recording material having a substrate and a radiation-sensitive coating.

19 Claims, No Drawings

POSITIVE-ACTING RADIATION-SENSITIVE MIXTURE AND RECORDING MATERIAL PRODUCED THEREWITH

The invention relates to a positive-acting radiation-sensitive mixture comprising
 a) a binder which is insoluble in water but soluble or at least swellable in aqueous alkaline solution,
 b) a compound which forms a strong acid under the action of actinic radiation and
 c) a compound which contains at least one C-O-C or C-O-Si bond which can be cleaved by an acid,
which is used in particular in the production of electronic components. The invention furthermore relates to a recording material having a substrate and a radiation-sensitive coating.

The miniaturization of electronic components, for which a resolution to within the range of less than 1 µm is required, was achieved essentially by novel lithographic techniques. The limit of the resolution is determined by the wavelength of the radiation used for reproducing the original. Shortwave radiation, such as high-energy UV, electron and X-ray radiation, is preferred. Accordingly, mixtures must be sufficiently sensitive to radiation of the wavelength used in each case. The article by C. G. Willson "Organic Resist Material—Theory and Chemistry [Introduction to Microlithography, Theory, Materials and Processing; Editors: L. F. Thompson, C. G. Willson and M. J. Bowden; ACS Symp. Ser. 219 (1983) 87; American Chemical Society, Washington] gives a survey of the requirements which radiation-sensitive mixtures have to meet.

In the production of positive photoresists, two-component mixtures comprising an alkali-soluble resin and a photosensitive quinonediazide compound were initially preferred. As a rule, a novolak was used as the alkali-soluble resin. The shelf life of such mixtures could be increased by adding primary, secondary and tertiary amino compounds or pyridine (DE-A 37 38 603). Owing to their absorption properties, such mixtures are, however, scarcely suitable for lithographic techniques which require the use of radiation having a wavelength of less than 300 nm.

So-called "chemically enhanced" systems are more suitable for such techniques. The chemical enhancement is based on the fact that an active agent, as a rule a Bronsted acid, is initially liberated from a "photoinitiator" by irradiation, and said agent then catalyzes a subsequent "dark reaction". These systems generally have high sensitivity. A distinction is made between two-component and three-component systems.

A two-component system comprises, for example, a photoinitiator and a polymer having acid-clearable bonds. The polymer is thus simultaneously a binder and an acid-cleavable compound. Any bases present in the surrounding air can penetrate into the resist layer, where they can neutralize the photolytically formed acid. A base concentration in the parts per billion (ppb) range in the air is sufficient to cause problems (S. A. MacDonald et al., Proc. SPIE—Int. Soc. Opt. Eng. 1991, 1466 (Adv. Resist Technol. Process. 8) and O. Nalamasu et al., Conference Reprints, SPE—Regional Technical Conference; Photopolymers: Principles, Processes and Materials, Ellenville, N.Y., 28.-30.10.1991, pages 225–234).

Three-component mixtures of the type stated in the introductory paragraph are already known, for example from DE-A 39 30 087 and DE-A 39 35 875.

The acid formed under the action of radiation cleaves the C-O-C or C-O-Si bonds of the compound c). The cleavage products formed thereby from the compound c) increase the solubility of the mixture in aqueous alkaline solution. In a coating applied to a substrate and containing or comprising this mixture, it is possible in this way to produce the image of an original. In order to obtain an image which is true to detail, the acid must not diffuse from the exposed parts of the coating into the unexposed parts thereof. This problem has already been recognized and described (L. Schlegel et al., J. Vac. Sci. Technol., B 9 (2) [1991] 278). It was found that the extent of the diffusion of the acid in the polymer matrix is dependent on a number of parameters. The temperatures at which a pre-bake and a post-exposure-bake take place and the glass transition temperature of the polymeric binder are of particular importance. In the systems investigated by L. Schlegel, the acid diffused to a distance of 520 nm. Diffusion occurs in the time span between the (imagewise) exposure and the development. The time span should be as short as possible, since otherwise the faithful reproduction of the mask is lost. The processing latitude is thus small. An attempt was made to counteract the deterioration of the image caused by diffusion by using bulky or polymer-bound acid precursors. In this case, however, the acid-cleavable compounds are frequently not cleaved to a sufficient extent. The developer can no longer completely remove the coating in the exposed parts.

The use of additives, such as adhesion promoters, wetting agents, colorants, sensitizers and plasticizers, in the "chemically enhanced" mixtures described above is known. Thus, DE-A 38 35 737 discloses that resist structures having higher heat distortion resistance are obtained by the addition of hydroxymethylsulfonylbenzene.

DE-A 41 24 426 discloses a photosensitive mixture which contains an alkali-soluble polymer, a compound which forms an acid under the action of actinic radiation and an organic base. On irradiation, the photolytically produced acid combines with the organic base to form a salt, which increases the solubility of the mixture in aqueous alkaline solution. The acid-forming compound and organic base are accordingly contained in equal amounts by weight in all mixtures mentioned as examples, so that, after irradiation, virtually no further free acid is present. No use is made of the principle of "chemical enhancement" in this mixture.

In the process according to EP-A 0 487 794, a positive-acting or negative-acting photoresist coating which contains a compound which forms an acid under the action of radiation is treated, before or after the imagewise exposure, with a solution of an acid acceptor (imidazole or a tertiary amine). The acid acceptor penetrates into the surface of the resist coating and completely binds the photochemically formed acid in the less strongly exposed edge regions, while sufficient acid still remains in the strongly exposed regions in order to catalyze a crosslinking or cleavage reaction. A resist image having an improved flank profile is thus obtained after post-exposure-bake and development.

EP-A 0 417 557 describes a positive-acting radiation-sensitive mixture which essentially contains an α,α-bissulfonyldiazomethane which forms an acid under the action of radiation, a compound having acid-cleavable C-O-C or C-O-Si bonds and a binder which is insoluble in water but soluble or swellable in aqueous alkaline solution. A dye, in particular crystal violet, may also be present in the mixture.

EP-A 0 345 016, which claims the priority of, for example, Japanese Application No. 88/180 624 (=JP-A 90/029 750), which in turn is reviewed in Patent Abstracts of Japan, Vol. 110, No. 183 (P 1053) of Apr. 12, 1990, discloses a positive-acting, radiation-sensitive mixture for the production of lithographic printing plates. It comprises an ortho-naphthoquinonediazide compound, an alkali-soluble resin and a so-called "activator". The activator reduces the sensitivity of the photo-sensitive coating to normal room lighting, increases the tolerance of the image-wise exposed coating to development and reduces foaming of the developer. It may be a polyoxyethylene polyoxypropylene sorbitol fatty ester or polyoxyethylene polyoxypropylene sorbitol fatty ether. This mixture, too, may contain a dye, such as crystal violet.

Derwent Abstract No. 92-126 589 (April 1992), in which JP-A 4-068 355 is reviewed, likewise discloses a positive-acting, radiation-sensitive mixture for the production of lithographic printing plates. It comprises an ortho-naphthoquinonediazide 4-sulfonic ester, a novolak resin and a specific nonionic surface-active agent. The latter may be a fatty acid alkanolamide [N,N-bis-( 2-hydroxyethyl)-fatty acid amide]. The surface-active agent likewise increases the sensitivity to normal room lighting.

It was therefore the object to find "chemically enhanced" mixtures which are sensitive to short-wave radiation, in particular deep-UV (=DUV) radiation, permit the reproduction of structural details in the submicron range and nevertheless allow a relatively large processing latitude.

The object could be achieved, surprisingly, by the addition of nitrogen-containing compounds. The present invention thus relates to a radiation-sensitive mixture comprising a) a binder which is insoluble in water but soluble or at least swellable in aqueous alkaline solution, b) a compound which forms an acid under the action of actinic radiation and c) a compound which contains at least one C-O-C or C-O-Si bond which can be cleaved by an acid, wherein the mixture additionally contains 0.1 to 70 mol %, based on the maximum amount of acid which can theoretically be produced from the compound b), of at least one compound having at least one nitrogen atom in an amine or amide bond.

The content of the stated nitrogen-containing compound or compounds is preferably about 0.5 to 50 mol %, particularly preferably about 1 to 40 mol %, once again based on the maximum amount of acid which can theoretically be produced from the compound b). At least 30 mol % of the theoretically available amount of acid are thus always in free form. If the content of additive is less than the stated amount, the processing latitude is not measurably greater; if said content is greater than said amount, the radiation sensitivity of the mixture is reduced to an excessive extent.

The nitrogen-containing additives had originally been added as antioxidants. They were intended to prevent the aldehydes formed from acetals under the action of acid from being oxidized by the atmospheric oxygen to carboxylic acids, but surprisingly resulted in higher resolution and permitted a broader working latitude.

Suitable additives are basic nitrogen compounds, such as 1,4-diazabicyclo[2.2.2]octane, and also basic and non-basic nitrogen compounds having relatively long hydrophobic, aliphatic radicals. Examples of such compounds are dodecylamine, bis-(2,2,6,6-tetramethylpiperidin-4-yl) decanedioate, bis-(1,2,2,6,6-pentamethylpiperidin-4-yl) decanedioate and 8-acetyl-3-dodecyl-7,7,9,9-tetramethyl-1,3,8-triazaspiro[4.5]decane-2,4-dione. Nitrogen compounds having surface-active properties, i.e. having a surfactant character, are generally preferred since they are evidently particularly homogeneously distributed in the resist coating. In particular, dodecylamine should be singled out here. Polymeric nitrogen compounds are also suitable. Polymeric 2,2,4-trimethyl-1,2-dihydroquinoline and a terpolymer of α-methylstyrene, N-octadecylmaleimide and N-(2,2,6,6-tetramethylpiperidin-4-yl)maleimide may be mentioned in this context. As shown in the examples, the amine nitrogen atoms may also be present in a secondary or tertiary amine structure. The amide nitrogen atoms are preferably monosubstituted or disubstituted, in particular by alkyl groups.

The boiling point of the nitrogen additives at atmospheric pressure is above 100° C., preferably above 150° C., particularly preferably above 180° C. The high boiling point is necessary so that the homogeneous distribution of the additive is retained even after the thermal treatments, and no concentration gradient forms.

The mixture according to the invention is distinguished by high sensitivity in the DUV range (200 to 300 nm). If the amount of additive in the mixture is increased, the radiation sensitivity decreases slowly while the processing latitude increases.

The polymeric binder a) is distinguished in particular by the fact that it is readily compatible, i.e. homogeneously miscible, with the other components of the mixture. In the wavelength range from 190 to 300 nm, it should have as low a self-absorption as possible and hence high transparency. Examples of such binders are homo- and copolymers comprising or containing an unsubstituted or substituted hydroxystyrene, in particular comprising or containing 3- or 4-hydroxystyrene or 4-hydroxy-3-methylstyrene. Other suitable monomers for the preparation of the binders are hydroxyaryl acrylates and N-hydroxyarylacrylamides. Suitable comonomers are also styrene, (meth)acrylic acid methylester and other monomers. If silicon-containing comonomers are used for the preparation of the binders, binders having high plasma etching resistance are obtained. The transparency of such binders in the DUV range is generally even higher, so that an even higher resolution can be achieved. Homo- and copolymers comprising or containing maleimide may also be used. These binders likewise exhibit high transparency in the DUV range. Unsubstituted or substituted styrene, vinyl ethers, vinyl esters, vinylsilanes and (meth)acrylates may be mentioned in particular as comonomers here. Copolymers of styrene and maleic anhydride or maleic half-esters generally have high solubility in aqueous alkaline solution. It is also possible to use a plurality of binders simultaneously, provided that they are miscible and do not adversely affect the optical qualities of the mixture. However, the mixtures preferably contain only one binder. Novolaks are not suitable as sole binders because their self-absorption in the short-wave range is too high. However, they may be used in a mixture with other binders of higher transparency. The novolaks may account for a proportion of up to 30% by weight, in particular up to 20% by weight, of the binder mixture.

The proportion of the binder or binder mixture a) is about 1 to 90% by weight, preferably 50 to 90% by weight, based in each case on the total weight of the nonvolatile components of the mixture.

The acid-producing compound b) may be selected from a large number of compounds. Mixtures of different acid-producing compounds are also suitable. Compounds which produce a strong acid under the action of actinic radiation are particularly suitable. These are primarily diazonium, phosphonium, sulfonium and iodonium salts, halogen compounds, ortho-quinonediazide-sulfonyl halides, ortho-quinonediazide-sulfonic esters and organometal/organohalogen combinations. The stated onium salts are used as a rule in the form of their salts which are soluble in organic solvents, generally as tetrafluoroborates, hexafluorophosphates, hexafluoroantimonates or hexafluoroarsenates. Among the halogen compounds, trichloromethyl and/or tribromomethyl-substituted triazines, oxazoles, oxadiazoles, thiazoles and 2-pyrones are preferred. Halogenated, in particular chlorinated and brominated, aromatics are also suitable as acid precursors. Owing to their high sensitivity and their high transparency in the DUV range, α,α'-bissulfonyldiazomethanes and α-sulfonyl-α'-carbonyldiazomethanes are particularly suitable acid precursors. By adding photosensitizers, the effectiveness of the acid-forming compounds can be further increased in many cases.

The proportion of acid-forming compounds is in general 0.01 to 7% by weight, preferably 0.05 to 5% by weight, based in each case on the total weight of the nonvolatile components of the mixture.

The acid-cleavable compounds c) in the mixture according to the invention are advantageously selected from the following classes of compounds:

(a) Compounds having at least one orthocarboxylic ester and/or carboxamidoacetal group, where the compounds may furthermore have polymeric character and the stated groups may occur in the main chain or as pendant groups, (b) oligomeric or polymeric compounds having repeating acetal and/or ketal groups in the main chain, (c) compounds having at least one enol ether or N-acyliminocarbonate group, (d) cyclic acetals or ketals of β-ketoesters or β-ketoamides, (e) compounds having silyl ether groups, (f) compounds having silyl enol ether groups, (g) monoacetals and monoketals of aldehydes and ketones, respectively, whose solubility in the developer is from 0.1 to 100 g/l, (h) ethers based on tertiary alcohols, (i) carboxylic esters and carbonates whose alcohol component is a tertiary alcohol, an allyl alcohol or a benzyl alcohol and (j) N,O-acetals, in particular N,O-polyacetals.

Mixtures of the abovementioned acid-cleavable materials may also be used. However, an acid-cleavable material which can be assigned to only one of the abovementioned classes is preferred.

Compounds having at least one C-O-C bond which can be cleaved by an acid are particularly preferred, i.e. the classes of compounds (a), (b), (g), (i) and (j) are particularly preferred. Among the compounds of class (b), the polymeric acetals should be singled out in particular, and among the acid-cleavable compounds of type (g) in particular those which are derived from aldehydes or ketones having a boiling point above 150° C., preferably above 200° C. The N,O-polyacetals of the type (j) are particularly preferred.

The acid-cleavable compound or the mixture of acid-cleavable compounds is present in a proportion of 1 to 50% by weight, preferably 5 to 35% by weight, based in each case on the total weight of the nonvolatile components of the mixture.

Finally, the mixture according to the invention may also contain dyes, pigments, plasticizers, wetting agents and leveling agents. In order to meet specific requirements, such as flexibility, adhesion and gloss, it may also comprise further components, such as polyglycols, cellulose ethers and in particular ethylcellulose.

If a substrate is to be coated, the radiation-sensitive mixture according to the invention is expediently dissolved in a solvent or in a combination of solvents. The choice of the solvent or solvent mixture depends finally on the coating method used, on the desired coating thickness and on the drying conditions. Furthermore, the solvent must be chemically inert to the other components of the coating under the conditions used. Particularly suitable solvents are glycols, such as ethylene glycol, glycol ethers, such as glycol monomethyl ether and glycol dimethyl ether, glycol monoethyl ether and glycol diethyl ether, propylene glycol monomethyl ether, glycol ether esters, such as ethylene glycol methyl ether acetate and propylene glycol methyl ether acetate, esters, such as ethyl acetate, butyl acetate, butyrolactone and hydroxyethyl acetate, ethers, such as tetrahydrofuran and dioxane, ketones, such as butanone, 4-methylpentan-2-one, cyclopentanone and cyclohexanone, carboxamides, such as N,N-dimethylformamide, N,N-dimethylacetamide and N-methylpyrrolidone, and phosphoramides, such as hexa-N-methylphosphorotriamide. Among these, the glycol ethers, aliphatic esters and ketones are preferred.

The solution prepared using the stated solvents has, as a rule, a solids content of 5 to 60% by weight, preferably 10 to 40% by weight.

The invention finally also relates to a radiation-sensitive recording material which essentially comprises a substrate and a radiation-sensitive coating present thereon and wherein the coating comprises the mixture according to the invention.

Suitable substrates are all materials of which capacitors, semiconductors, multilayer printed circuits or integrated circuits consist or from which they can be produced. These include in particular thermally oxidized and/or aluminum-coated silicon substrates, which may also be doped, as well as substrates comprising silicon nitride, gallium arsenide and indium phosphide. The substrates known for the production of liquid crystal displays, such as glass and indium tin oxide, are also suitable. Other substrates which may be used are metal sheets and metal foils, in particular those comprising aluminum, copper and zinc. Finally, bimetal and trimetal foils, electrically nonconductive films coated with metals by vapor deposition and paper are also suitable. The substrates may be thermally pretreated, surface-roughened, etched or, for modifying the surface, for example for improving the hydrophilic properties, treated with special chemicals.

If required, an adhesion promoter is used. In the case of silicon and silica substrates, in particular aminosilanes, such as 3-aminopropyltriethoxysilane and hexamethyldisilazane, are suitable for this purpose.

However, the mixture according to the invention may also be used for the production of photomechanical recording layers, such as printing plates for letterpress printing, lithographic printing and screen printing, and of relief copies. Suitable substrates for this purpose are in particular aluminum sheets which can be anodically oxidized, grained and/or silicate-coated. Zinc sheets, unplated or chromium-plated steel sheets, plastic films and paper may be used.

The recording material according to the invention is exposed imagewise to actinic radiation. Particularly suitable radiation sources are metal halide lamps, carbon arc lamps and xenon/mercury vapor lamps. Exposure may also be effected using laser beams, electron beams or X-rays. Radiation having a wavelength of 190 to 260 nm is preferably used. Xenon/mercury vapor lamps are particularly suitable for producing such radiation. Excimer lasers, in particular KrF and ArF excimer lasers, which emit radiation having a wavelength of 248 and 193 nm, respectively, are also suitable.

The thickness of the photosensitive coating depends on the intended use. It is in general between 0.1 and 100 μm, preferably between 0.5 and 10 μm, particularly preferably about 1.0 μm.

The recording material according to the invention can be produced by applying the mixture according to the invention to a substrate by spraying, flow-coating, roller-coating, spin-coating or immersion coating. The solvent generally required for the coating process is then removed, usually by evaporation. For this purpose, the coated substrate can be heated to temperatures up to 150° C. However, the mixture may also be applied to a temporary substrate, from which it is then transferred to the final substrate with the use of pressure and elevated temperature. In principle, all stated substrates may be used as temporary substrates.

The exposed recording material is then treated with a developer to reveal the positive image. Usually, an aqueous alkaline developer, which is preferably free of metal ions, is used for this purpose. A preferred developer free of metal ions is an aqueous tetraalkylammonium hydroxide, specifically tetramethylammonium hydroxide, solution. The developer has in general a solids content of 0.1 to 15% by weight, preferably 0.5 to 5% by weight. In order to promote detachment of the exposed coating parts from the substrate, the developer may furthermore contain relatively small amounts of a wetting agent.

The developed resist structures may also be post-cured. This is generally achieved by heating on a hotplate to a temperature below the flow temperature, followed by uniform exposure to the UV radiation (200 to 250 nm) of a xenon/mercury vapor lamp. As a result of the post-bake, the resist structures are crosslinked so that they are generally stable up to temperatures above 200° C. and do not begin to flow. The post-bake can also be carried out without increasing the temperature, solely by the action of UV radiation.

The examples described below illustrate the invention but are not intended to impose any restriction. Below, pbw is parts by weight.

EXAMPLES 1 TO 18

A radiation-sensitive mixture comprising 69 pbw of poly(4-hydroxy-3-methylstyrene) ($M_w$: 15,000), 29 pbw of poly-N,O-acetal, prepared from benzaldehyde and 2-hydroxyethyl N-propylcarbamate, and 2 pbw of bis-(4-chlorobenzenesulfonyl)-diazomethane
was dissolved in propylene glycol monomethyl ether acetate to give a 20% strength by weight solution. The following additives were added to portions of this solution:

| Additive No. | |
|---|---|
| 1 | 1,4-diazabicyclo[2.2.2]octane (®Dabco), |
| 2 | dodecylamine, |
| 3 | bis-(2,2,6,6-tetramethylpiperidin-4-yl) decanedioate (®Tinuvin 770 DF), |
| 4 | bis-(1,2,2,6,6-pentamethylpiperidin-4-yl) decanedioate (®Tinuvin 765), |
| 5 | 8-acetyl-3-dodecyl-7,7,9,9-tetramethyl-1,3,8-triazaspiro[4.5]decane-2,4-dione (®Tinuvin 440), |
| 6 | polymeric 2,2,4-trimethyl-1,2-dihydroquinoline (®Lowinox ACP), |
| 7 | terpolymer of α-methylstyrene, N-octadecylmaleimide and N-(2,2,6,6-tetramethylpiperidin-4-yl)-maleimide (®Lowilite 62). |

The photoresist solutions with or without the addition of additives were then filtered through a filter having a pore size of 0.2 μm and thereafter applied to a silicon wafer having a diameter of 7.62 cm by spin-coating. After drying had been effected on the hotplate (1 min at 110° C.), the thickness of the radiation-sensitive coating was 1.07 μm.

The wafers coated in this manner were exposed through a gray wedge mask of the Optoline type to 248 nm UV radiation from a xenon/mercury vapor lamp with an energy of 30 mJ/cm$^2$. One minute after the end of the exposure, the wafers were heated on a hotplate (post-exposure-bake; 1 min at 60° C.). After a further 10, 30 or 60 minutes, the coated wafers were then developed with an aqueous 0.27N tetramethylammoniumhydroxide solution for 60 s.

The layer thickness in the parts exposed through the particular steps of the gray wedge was then measured. The energy dose required for complete development of the coating was determined from these values.

The manner in which the energy dose required for complete development of the coating changes when the time span between post-exposure-bake and development is varied was then investigated (Table 1). Furthermore, the effect of the additives on the contrast values was determined for standing times of 10 min and of 60 min between post-exposure-bake and development. The definition of the contrast of a positive resist coating is given, for example, in L. F. Thompson et al., Introduction to Microlithography; Theory, Materials and Processing, ACS Symposium Series 219 [1983] 170. The results are summarized in Table 2.

TABLE 1

| Example No. | Additive No. | Amount of additive pbw | Energy dose (mJ/cm$^2$) required for complete development with a time span between post-exposure-bake and development of | | | |
|---|---|---|---|---|---|---|
| | | | 10 min | 30 min | 60 min | 2 days |
| 1 | 1 | 0.3 | 8.6 | 8.6 | 7.3 | 4.2 |
| 2 | 1 | 2.9 | 15.4 | 13.8 | | |
| 3 | 2 | 0.5 | 7.5 | 6.8 | 5.9 | |
| 4 | 2 | 4.7 | 12.3 | 12.1 | 12.3 | |
| 5 | 3 | 1.2 | 7.5 | 7.5 | | |
| 6 | 4 | 1.3 | 7.7 | 7.4 | | |
| 7 | 4 | 13 | 12.6 | | 10.8 | |
| 8 | 5 | 1.1 | 9.2 | 9.1 | | |
| 9 | 5 | 10.8 | 13.4 | | 11.0 | |
| 10 | 6 | 0.4 | 7.5 | 6.6 | 6.0 | |
| 11 | 6 | 21 | 15.4 | | 12.6 | |
| 12 | 7 | 1 | 2.1 | 7.5 | 6.7 | 6.1 |
| 13V* | — | — | 9.0 | 7.7 | 7.0 | 3.6 |

*Comparative example

The values show that substantially longer standing times are possible with the mixtures according to the invention. This is due to the reduced diffusion of the acid formed under the action of the radiation into the unexposed parts of the coating. The dark reaction is thus slowed down.

TABLE 2

| Example No. | Additive No. | Amount of additive pbw | Effect on the contrast values of changing the standing time Contrast 60 min | Contrast change 10/60 min in % |
|---|---|---|---|---|
| 1 | 1 | 0.3 | 9.3 | +55 |
| 3 | 2 | 0.5 | 8.7 | +81 |
| 5 | 3 | 1.2 | 8.9 | +44 |
| 7 | 4 | 1.3 | 9.4 | +45 |
| 10 | 6 | 0.4 | 9.4 | +71 |
| 12 | 7 | 2.1 | 9.7 | +70 |

TABLE 2-continued

| Example No. | Additive No. | Amount of additive pbw | Effect on the contrast values of changing the standing time Contrast change 60 min | Contrast change 10/60 min in % |
|---|---|---|---|---|
| 14 | 5 | 27.1 | 8.2 | +156 |
| 13V* | — | — | 7.8 | +13 |

*Comparative example

The following examples show how the energy dose required for complete development changes when the time span between exposure and post-exposure-bake is changed. In these examples, the time span between post-exposure-bake and development was kept constant at 1 min. The results are summarized in Table 3.

TABLE 3

| Example No. | Addtive No. | Amount of addtive pbw | Energy dose (mj/cm²) required for complete development with a time span between exposure and post-exposure-bake of | | |
|---|---|---|---|---|---|
| | | | 1 min | 30 min | 60 min |
| 15 | 2 | 0.5 | 8.5 | 7.4 | 7.1 |
| 16 | 2 | 4.7 | 12.2 | 12.2 | 10.0 |
| 17 | 4 | 1.3 | 8.4 | 7.4 | 7.4 |
| 18 | 4 | 13 | 14.0 | 11.9 | 11.2 |
| 13V* | — | — | 8.3 | 7.1 | 6.6 |

*Comparative example

EXAMPLE 19

A radiation-sensitive mixture comprising

| 69 pbw | of poly(4-hydroxy-3-methylstyrene) (M$_w$: 15,000), |
| 29 pbw | of poly-N,O-acetal, prepared from benzaldehyde and 2-hydroxyethyl N-propylcarbamate, |
| 2 pbw | of bis-(4-chlorobenzenesulfonyl)-diazomethane and |
| 0.5 pbw | of 8-acetyl-3-dodecyl-7,7,9,9-tetramethyl-1,3,8-triazaspiro[4.5]decane-2,4-dione | was dissolved in propylene glycol monomethyl ether acetate to give a 20% strength by weight solution. The solution was filtered as described above and was applied to a silicon wafer having a diameter of 7.62 cm (3 inches) by spin-coating. After drying had been effected on the hotplate (1 min at 120° C.), the thickness of the radiation-sensitive coating was 1.07 μm.

The wafer coated in this manner was then exposed imagewise with the aid of a mask to 248 nm UV radiation (KrF excimer laser). The radiation dose was 25 mJ/cm². The standing time between exposure and post-exposure-bake (60° C., 1 min) was 30 min. After the post-exposure-bake, the wafer was developed with an aqueous 0.27N tetramethylammonium hydroxide solution. The investigation under a scanning electron microscope showed that structures down to 0.35 μm lines and spaces were resolved.

EXAMPLE 20 (Comparative example)

A resist mixture as in the preceding example was used, but without the addition of the additive. The radiation dose in this case was 17 mJ/cm². The investigation under a scanning electron microscope showed that a resolution of not more than 0.5 μm can be achieved with this mixture.

EXAMPLE 21

A radiation-sensitive mixture comprising

| 69 pbw | of poly(4-hydroxy-3-methylstyrene) (M$_w$: 15,000), |
| 29 pbw | of poly-N,O-acetal, prepared from benzaldehyde and 2-hydroxyethyl N-propylcarbamate, |
| 2 pbw | of bis-(4-chlorobenzenesulfonyl)-diazomethane and |
| 0.215 pbw | of 8-acetyl-3-dodecyl-7,7,9,9-tetramethyl-1,3,8-triazaspiro[4.5]decane-2,4-dione | was dissolved in propylene glycol monomethyl ether acetate to give a 20% strength by weight solution. The solution was filtered as described above and was applied to a silicon wafer having a diameter of 7.62 cm (3 inches) by spin-coating. After drying had been effected on the hotplate (1 min at 120° C.), the thickness of the radiation-sensitive coating was 1.07 μm.

The wafer coated in this manner was then exposed imagewise with the aid of a mask to 248 nm UV radiation (KrF excimer laser). The radiation dose was 25 mJ/cm². The standing time between exposure and post-exposure-bake (60° C., 1 min) was 30 min. After the post-exposure-bake, the wafer was developed with an aqueous 0.27N tetramethylammonium hydroxide solution for 1 min at 21° C. The width of the lines and spaces was determined with the aid of a scanning electron microscope. The distance between the feet was determined in the case of isolated lines, and the distance between the upper resist edges was determined in the case of spaces.

EXAMPLE 22 (Comparative example)

For comparison, resist structures which had been obtained using the resist mixture described above, but without the addition of an additive, were measured. Examples 21 and 22 are compared in Table 4.

TABLE 4

| Normal scale in pm | Deviation in % | | | |
|---|---|---|---|---|
| | Lines | | Spaces | |
| Examples | 21 | 22 | 21 | 22 |
| 0.50 | 9 | 40 | 10 | 31 |
| 0.45 | 12 | 47 | 11 | 36 |
| 0.40 | 15 | 53 | 16 | 42 |
| 0.35 | 20 | 61 | 21 | 47 |

We claim:
1. A radiation-sensitive mixture comprising
   a) a binder which is insoluble in water but soluble or at least swellable in aqueous alkaline solution,
   b) a compound which forms an acid under the action of actinic radiation and
   c) a compound which contains at least one C-O-C or C-O-Si bond which can be cleaved by an acid, wherein said mixture additionally contains 0.1 to 70 mol %, based on the maximum amount of acid which can theoretically be produced from the compound b), of at least one compound d) having at least one amine or amide bond, this compound being 1,4-diazabicyclo[2.2.2]octane, polymeric 2,2,4-trimethyl-1,2-dihydroquinoline, a terpolymer of α-methylstyrene, N-octadecylmaleimide, and N-(2,2,6,6-tetramethylpiperidin- 4-yl)-maleimide, dodecylamine, bis(2,2,6,6-tetramethylpiperidin-4-yl) decanedioate, bis-(1,2,2,6,6-pentamethylpiperidin-4-yl) decanedioate or 8-acetyl-3-dodecyl-7,7,9,9-tetramethyl- 1,3,8-triazaspiro[4.5]decane-2,4-dione.

2. The radiation-sensitive mixture as claimed in claim 1, wherein the content of d) is 0.5 to 50 mol % based on the maximum amount of acid which can theoretically be produced from the compound b).

3. The radiation-sensitive mixture as claimed in claim 2, wherein the proportion of the binder a) is about 1 to 90% by weight based on the total weight of a), b), c), d) and any other nonvolatile components of the mixture.

4. The radiation-sensitive mixture as claimed in claim 2, wherein the proportion of the acid-forming compound b) is 0.01 to 7% by weight based on the total weight of a), b), c), d) and any other nonvolatile components of the mixture.

5. The radiation-sensitive mixture as claimed in claim 2, wherein the proportion of the acid-cleavable compound is 1 to 50% by weight based on the total weight of a), b), c), d) and any other nonvolatile components of the mixture.

6. A radiation-sensitive recording material having a substrate and a radiation-sensitive coating present thereon, wherein the coating comprises the mixture according to the invention, as claimed in claim 2.

7. The radiation-sensitive mixture as claimed in claim 1, wherein the proportion of the binder a) is about 1 to 90% by weight based on the total weight of a), b), c), d) and any other nonvolatile components of the mixture.

8. The radiation-sensitive mixture as claimed in claim 7, wherein the proportion of the acid-forming compound is 0.01 to 7% by weight based on the total weight of a), b), c), d) and any other nonvolatile components of the mixture.

9. The radiation-sensitive mixture as claimed in claim 7, wherein the proportion of the acid-cleavable compound is 1 to 50% by weight based on the total weight of a), b), c), d) and any other nonvolatile components of the mixture.

10. A radiation-sensitive recording material having a substrate and a radiation-sensitive coating present thereon, wherein the coating comprises the mixture according to the invention, as claimed in claim 7.

11. The radiation-sensitive mixture as claimed in claim 1, wherein the proportion of the acid-forming compound b) is 0.01 to 7% by weight based on the total weight of a), b), c), d), and any other nonvolatile components of the mixture.

12. The radiation-sensitive mixture as claimed in claim 11, wherein the proportion of the acid-cleavable compound is 1 to 50% by weight based on the total weight of a), b), c), d) and any other nonvolatile components of the mixture.

13. A radiation-sensitive recording material having a substrate and a radiation-sensitive coating present thereon, wherein the coating comprises the mixture according to the invention, as claimed in claim 11.

14. The radiation-sensitive mixture as claimed in claim 1, wherein the proportion of the acid-cleavable compound is 1 to 50% by weight based on the total weight of a), b), c), d) and any other nonvolatile components of the mixture.

15. A radiation-sensitive recording material having a substrate and a radiation-sensitive coating present thereon, wherein the coating comprises the mixture according to the invention, as claimed in claim 14.

16. A radiation-sensitive recording material having a substrate and a radiation-sensitive coating present thereon, wherein the coating comprises the mixture according to the invention, as claimed in claim 1.

17. The radiation-sensitive mixture as claimed in claim 1, wherein compound b) comprises one or more α,α'-bissulfonyl-diazomethanes or α-sulfonyl-α'-carbonyldiazomethanes.

18. The radiation-sensitive mixture as claimed in claim 1, wherein compound c) comprises one or more N,O-acetals.

19. The radiation-sensitive mixture as claimed in claim 1, wherein compound c) comprises one or more N,O-polyacetals.

* * * * *